(12) United States Patent
Kendrick

(10) Patent No.: US 10,759,061 B2
(45) Date of Patent: Sep. 1, 2020

(54) ROBOTIC TOOL CHANGER HAVING OVER-CENTER CAM AND REMOTE POWER SOURCE

(71) Applicant: ATI Industrial Automation, Inc., Apex, NC (US)

(72) Inventor: Baron Kendrick, Apex, NC (US)

(73) Assignee: ATI Industrial Automation, Inc., Apex, NC (US)

( * ) Notice: Subject to any disclaimer, the term of this patent is extended or adjusted under 35 U.S.C. 154(b) by 0 days.

(21) Appl. No.: 16/118,722

(22) Filed: Aug. 31, 2018

(65) Prior Publication Data

US 2020/0070362 A1 Mar. 5, 2020

(51) Int. Cl.

| | |
|---|---|
| *B23B 31/107* | (2006.01) |
| *B25J 15/04* | (2006.01) |
| *B25J 19/06* | (2006.01) |
| *B25J 9/10* | (2006.01) |
| *H01L 21/677* | (2006.01) |
| *B25J 9/02* | (2006.01) |
| *B23B 31/26* | (2006.01) |

(52) U.S. Cl.
CPC .......... *B25J 15/0425* (2013.01); *B25J 9/101* (2013.01); *B25J 19/06* (2013.01); *B23B 31/1071* (2013.01); *B23B 31/263* (2013.01); *B23B 2260/02* (2013.01); *B25J 9/023* (2013.01); *H01L 21/67742* (2013.01)

(58) Field of Classification Search
CPC .... B25J 15/0425; B25J 9/101; B25J 15/0416; B25J 15/0458; B23B 2260/02; B23B 31/1071; B23B 31/263; Y10T 279/1037
See application file for complete search history.

(56) References Cited

U.S. PATENT DOCUMENTS

| | | | |
|---|---|---|---|
| 5,452,631 A * | 9/1995 | Erickson | B23B 29/046 82/160 |
| 2016/0195119 A1* | 7/2016 | Bookheimer | F16B 19/02 29/428 |
| 2017/0144230 A1* | 5/2017 | Rosso | B23B 31/4046 |

\* cited by examiner

*Primary Examiner* — Sunil K Singh
*Assistant Examiner* — Paul M Janeski
(74) *Attorney, Agent, or Firm* — Coats + Bennett, PLLC

(57) ABSTRACT

A robotic tool changer includes a locking mechanism that enhances safety. More particularly, the locking mechanism is an "over center" locking mechanism that maintains a constant lock force on a tool. The lock force exerted on the tool by the locking mechanism remains substantially constant, even after a motor providing power to the robotic tool changer is removed, and after the robotic tool changer experiences mechanical wear.

23 Claims, 4 Drawing Sheets

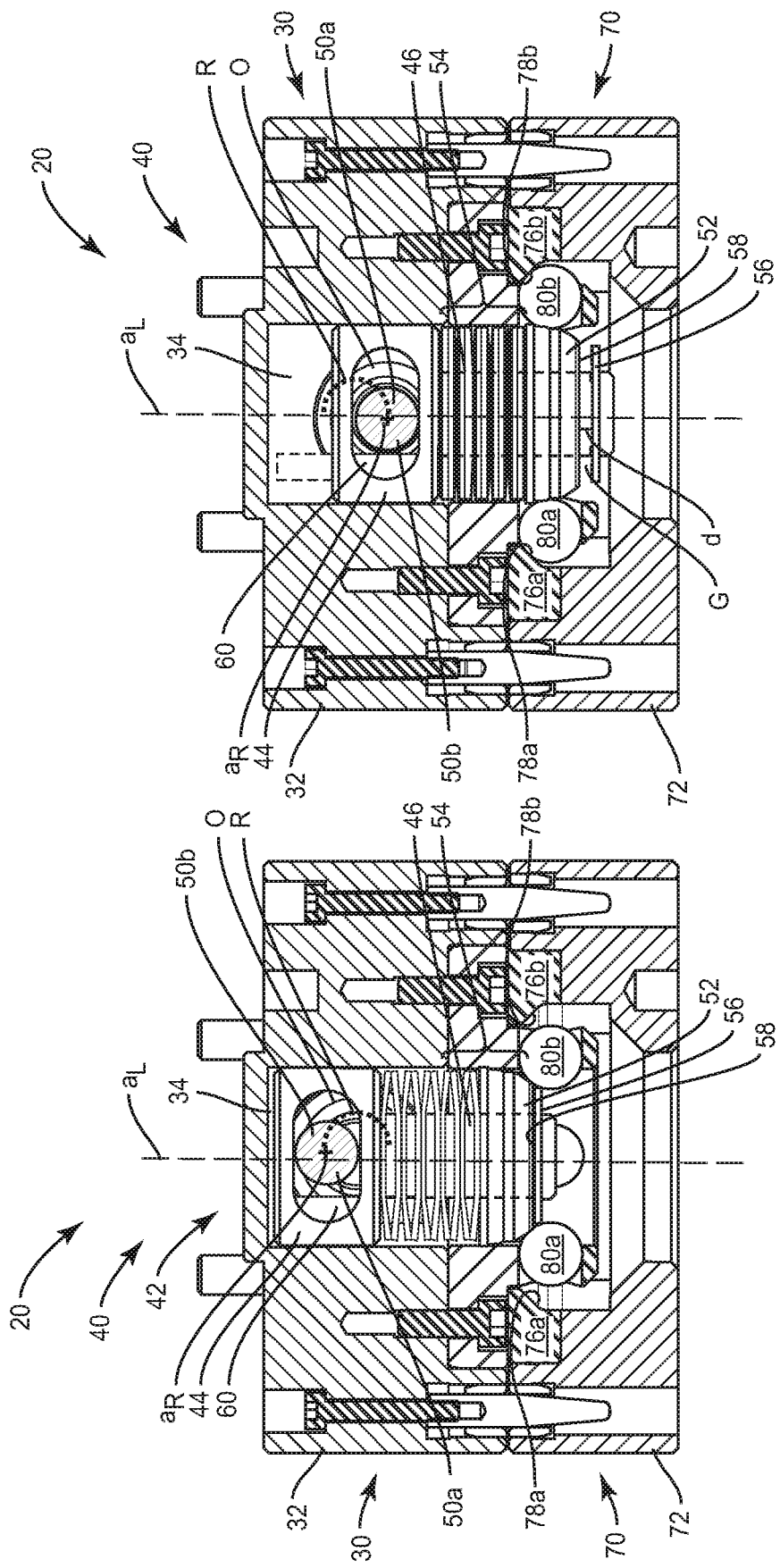

ROBOTIC TOOL CHANGER HAVING OVER-CENTER CAM AND REMOTE POWER SOURCE

FIELD OF INVENTION

The present invention relates generally to robotics, and in particular to a lock mechanism for a robotic tool changer.

BACKGROUND

Industrial robots have become an indispensable part of modern manufacturing. Whether transferring semiconductor wafers from one process chamber to another in a cleanroom or cutting and welding steel on the floor of an automobile manufacturing plant, robots perform many manufacturing tasks tirelessly, in hostile environments, and with high precision and repeatability.

In many robotic manufacturing applications, it is cost-effective to utilize a relatively generic robot arm to accomplish a variety of tasks. For example, in an automotive manufacturing application, a robot arm may be utilized to cut, grind, or otherwise shape metal parts during one phase of production, and perform a variety of welding tasks in another. Different welding tool geometries may be advantageously mated to a particular robot arm to perform welding tasks at different locations or in different orientations.

In these applications, a robotic tool changer is used to mate different robotic tools to the robot. One half of the tool changer, called the master unit, is permanently affixed to a robot arm. The other half, called the tool unit, is affixed to each robotic tool that the robot may utilize. The various robotic tools a robot may utilize are typically stored, within the range of motion of the robot arm, in tool stands which are sized and shaped to hold each tool securely when not in use. When the robot arm positions the master unit, on the end of the robot arm, adjacent to a tool unit connected to a desired robotic tool sitting in a tool stand, a coupling mechanism is actuated that mechanically locks the master and tool units together, thus affixing the robotic tool to the end of the robot arm. The tool changer thus provides a consistent mechanical interface between a robot arm and a variety of robotic tools. A tool changer may also pass utilities to a robotic tool.

Robotic tools may require utilities, such as electrical current, air pressure, hydraulic fluid, cooling water, electronic or optical data signals, and the like, for operation. When numerous different tools—requiring different utilities—are utilized by the same robot, the utility connections must be manually established each time a tool is changed. To eliminate this procedure, one important function of a robotic tool changer is to provide utility-passing modules. Such modules may be attached to standardized locations on the master and tool units of the robotic tool changer. The modules include mating terminals, valve connections, electrical connectors, and the like, making the utilities available to the selected tool when it is coupled to the robot arm. Many tool changers include one or more standard-sized "ledges" about their periphery, to which various utility-passing modules may be attached, as required. Tool changers and utility-passing modules are well known in the robotics arts, and are commercially available, such as from the assignee, ATI Industrial Automation of Apex, N.C.

As mentioned above, when not in use, each robotic tool is stored in a special rack, or tool stand, within the operative range of the robotic arm. Robot arm controller software "remembers" where each robotic tool is, and each robotic tool is returned to precisely the same position in its tool holder prior to the tool changer decoupling. Similarly, the robot arm controller software "knows" precisely where the next desired robotic tool is stored, and it positions the master unit of the tool changer (on the robot arm) adjacent to the tool unit (on the desired robotic tool), and then actuates the tool changer to couple the next robotic tool to the robot arm.

Safety is a paramount concern in manufacturing environments. A variety of workplace regulations govern the use of large industrial robots, with heavy robotic tools attached thereto. For example, ISO 13849, "Safety of machinery—Safety related parts of control systems," defines five Performance Levels (PL), denoted A through E. Performance Level D (PLD), mandated for many industrial robotics applications, requires a probability of less than $10^{-6}$ dangerous failures per hour—that is, at least a million hours of operation between dangerous failures.

The most likely dangerous failure, from the perspective of a robotic tool changer and its functionality, is an inadvertent decoupling of the master and tool units, allowing a robotic tool to fall free from the robot arm. This danger has long been recognized, and state-of-the-art robotic tool changer design minimizes the risk. For example, in the event positive coupling power, such as pneumatic pressure, is lost during operation, "failsafe" designs ensure that a tool will not separate from the robot arm. See, e.g., U.S. Pat. Nos. 7,252,453 and 8,005,570, assigned to ATI Industrial Automation, the assignee of the present application.

Besides preventing accidental robotic tool drops resulting from loss of pressure, ATI Industrial Automation has also addressed the safety hazard of software bugs or inadvertent commands presenting a valid "decouple" command to a robotic tool changer at the wrong time, such as when a tool is in use. U.S. Pat. No. 6,840,895 describes an interlock circuit that precludes even a valid "uncouple" command from reaching a coupling mechanism of a robotic tool changer if a tool side safety interlock is not engaged. The tool side safety interlock is automatically engaged whenever the robotic tool is placed in its tool stand, and is disengaged whenever the robotic tool is removed from the tool stand.

Interlock circuits can effectively prevent inadvertent decoupling of a robotic tool changer. However, to meet very stringent safety standards, such as ISO 13849 PLD, critical elements (circuit components, pneumatic valves, and the like) must be redundant. Furthermore, to ensure that the designed redundancy is not illusory, such as if one of the redundant circuits were to fail, monitoring means must be added that constantly ensure all critical elements are not only present, but are fully operational and functional. Such redundancy and monitoring systems add cost, complexity, and weight to a robotic tool changer.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

Embodiments of the present disclosure provide a locking mechanism for a robotic tool changer. In one embodiment, the robotic tool changer comprises a master unit configured to be attached to a robot and to couple to a tool unit. The master unit comprises a housing having a central bore defining a longitudinal axis, a piston disposed within the central bore and moveable along the longitudinal axis between a retracted position and an extended position, and a crankshaft having a primary axis transverse to the longitudinal axis and comprising an offset segment disposed within an opening in the piston. The crankshaft is configured to rotate in a first direction to move the piston along the longitudinal axis from the retracted position to the extended position. A mechanical stop is configured to limit the rotation of the crankshaft in the first direction. In this embodiment, the offset segment has a secondary axis parallel to the primary axis. When the piston is in the extended position, the secondary axis is disposed between the longitudinal axis and the mechanical stop. Further, the tool unit is configured to be attached to a tool and to couple to the master unit as the piston moves to the extended position and presses rolling members in the master unit against a retention surface.

In one embodiment, when the master unit and the tool unit are coupled together, the rolling members exert a force on the piston urging it toward the retracted position. This urges the offset segment of the crankshaft to rotate further in the first direction beyond the longitudinal axis and toward the mechanical stop.

Additionally, in one or more embodiments, the crankshaft is further configured to rotate in a second direction, opposite the first direction, to move the piston from the extended position to the retracted position.

In one embodiment, when the piston is in the extended position, the force applied to the piston by the rolling members opposes the rotation of the crankshaft in the second direction.

In one embodiment, the piston comprises a shaft, a head attached to a first end of the shaft and comprising the opening configured to receive the offset segment of the crankshaft, a retaining member attached to a second end of the shaft opposite the first end, and a cam disposed between the head and the retaining member. The cam is movably coupled to the shaft and configured to move along the longitudinal axis independently of the shaft as the piston moves between the retracted position and the extended position.

In some embodiments, the piston further comprises a biasing member movably coupled to the shaft and disposed between the head and the cam. In such embodiments, the biasing member is configured to bias the cam to press the rolling members against the retention surface as the piston moves from the retracted position to the extended position, and bias the head towards the retracted position as the piston moves from the extended position to the retracted position.

In one embodiment, the biasing member comprises a plurality of stacked conical spring washers.

In one embodiment, the retaining member directly contacts a surface of the cam when the piston is in the retracted position. Additionally, when the piston is in the extended position, the retaining member is spaced away from the surface of the cam thereby forming a gap between the surface of the cam and the retaining member.

In one embodiment, a size of the gap between the surface of the cam and the retaining member is proportional to a biasing force exerted on the cam by the biasing member.

In one or more embodiments, the crankshaft is configured to connect to an external drive source, and the piston is configured to remain in the extended position and maintain a substantially constant force pressing the rolling members against the retention surface in an absence of power provided by the drive source.

In one embodiment, the longitudinal axis divides a cross-section of the offset segment of the crankshaft into first and second unequal cross-sectional areas with the first cross-sectional area being larger than the second cross-sectional area when the piston is in the retracted position, and with the second cross-sectional area being larger than the first cross-sectional area when the piston is in the extended position.

In one embodiment of the present disclosure, a robotic tool changer comprises a master unit configured to connect to both a tool unit and a robot. In this embodiment, the master unit comprises a piston, a crankshaft comprising a primary axis transverse to the longitudinal axis and an offset segment. The piston is configured to move within a housing along a longitudinal axis between a retracted position in which the tool unit can be disconnected from the master unit, and an extended position in which the tool unit cannot be disconnected from the master unit. The crankshaft is configured to be connected to a drive source. The offset segment has a secondary axis parallel to the primary axis and is disposed within an opening in the piston. In this embodiment, the offset segment is configured to move along a radial path in a first direction to move the piston from the retracted position to the extended position. As the piston moves to the extended position, the secondary axis moves through the longitudinal axis such that when the piston is in the extended position, the longitudinal axis divides a cross-section of the offset segment of the crankshaft into first and second unequal cross-sectional areas with the first cross-sectional area comprising the secondary axis and being larger than the second cross-sectional area.

In one embodiment, the piston is configured to remain in the extended position to maintain a substantially constant lock force on the tool unit in an absence of power provided by the drive source.

In one embodiment, the offset segment is in a first radial position at a first terminal end of the radial path when the piston is in the retracted position, and in a second radial position at a second terminal end of the radial path when the piston is in the extended position.

In one embodiment, the offset segment is configured to move along the radial path from the first radial position to the second radial position to move the piston to the extended position, and from the second radial position to the first radial position to move the piston to the retracted position.

In one embodiment, the robotic tool changer further comprises a mechanical stop configured to limit movement of the offset segment beyond the second radial position.

In one embodiment, the piston comprises a head comprising the opening configured to receive the offset segment, a cam movably attached to a shaft of the piston and configured to extend into the tool unit when the piston moves toward the extended position, a retaining member attached to the shaft proximate the cam, and a biasing member disposed between the head and the cam.

In one embodiment, when the master unit is coupled to the tool unit and the piston is in the extended position, rolling members in the master unit apply a force to the one or more cam surfaces on the cam that urges the offset segment to move further along the radial path to the second radial position.

In one embodiment, the retaining member directly contacts a surface of the cam when the piston is in the retracted position. However, when the piston is in the extended position, the retaining member is spaced away from the surface of the cam thereby forming a gap between the surface of the cam and the retaining member. A size of the gap is proportional to a biasing force exerted by the biasing member.

In one embodiment, the present disclosure provides a robotic tool changer comprising a master unit configured to connect to both a tool unit and a robot. In this embodiment, the master unit comprises a piston comprising a shaft and a head, and configured to move within a housing along a longitudinal axis between a retracted position in which the tool unit can be disconnected from the master unit, and an extended position in which the tool unit cannot be disconnected from the master unit. The master unit also comprises a crankshaft comprising a primary axis transverse to the longitudinal axis, and an offset segment disposed within an opening in the head of the piston. In these embodiments, the crankshaft is configured to rotate in a first direction to move the piston between the retracted and extended positions. The master unit further comprises a cam movably coupled to the shaft. The cam is configured to move along the longitudinal axis independently of the shaft as the piston moves between the retracted position and the extended position. A biasing member is disposed between the head of the piston and the cam, and a retaining member is disposed on the shaft proximate the cam. The retaining member is spaced away from the cam when the piston is in the extended position, and contacts the cam when the piston is in the retracted position. The distance between the retaining member and the cam when the piston is in the extended position is proportional to a biasing force exerted by the biasing member on the retaining member.

In one embodiment, the mechanical stop limits the rotation of the crankshaft in the first direction.

In one embodiment, the offset segment has a secondary axis parallel to the primary axis. The secondary axis is disposed between the longitudinal axis and the mechanical stop when the piston is in the extended position.

In one embodiment, when the master unit is coupled to the tool unit and the piston is in the extended position, one or more cam surfaces on the cam are configured to receive a force applied by rolling members in the master unit that urges the piston toward the retracted position, thereby urging the offset segment towards the mechanical stop.

In one embodiment, the crankshaft is configured to be connected to an external drive source that drives the crankshaft to move the piston between the retracted position and the extended position. Further, the crankshaft is configured to maintain the piston in the extended position in an absence of power provided by the drive source.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

FIGS. 4A-4B illustrate a piston of the locking mechanism in a retracted position (unlocked) and an extended position (locked) according to one embodiment of the present disclosure.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 1:
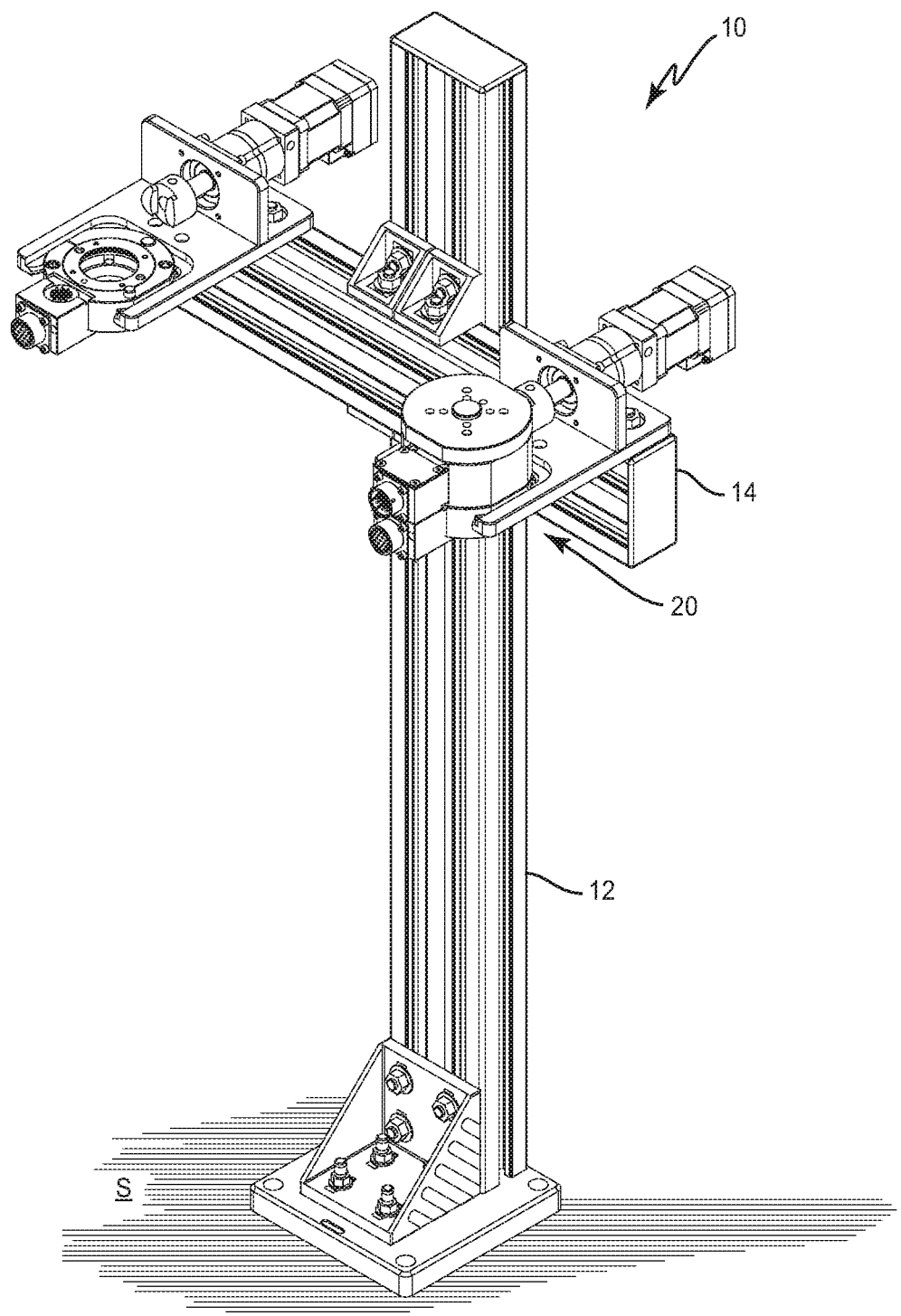
FIG. 1 is a perspective view of a robotic tool changer mounted on a tool stand and configured according to one embodiment of the present disclosure.

Turning now to the drawings, FIG. 1 illustrates a tool stand 10 configured according to one embodiment of the present disclosure. In this embodiment, the tool stand 10 comprises a vertical member 12, a horizontal member 14, and one or more robotic tool changers 20. The vertical member 12 is fixedly attached to a support surface S (e.g., a ground surface) using one or more mechanical fasteners (e.g., bolts) and provides a stable support structure for both the horizontal member 14 and the robotic tool changer 20. The horizontal member 14 slidingly engages the vertical member 12, and is movable vertically to selectively change the height of horizontal member 14 above support surface S. The robotic tool changer 20 attaches to the horizontal member 14, and moves with the horizontal member 14 to adjust its height above the support surface S.

As described in more detail below, the robotic tool changer 20 is configured with a locking mechanism that enhances safety for an operator of the robotic tool changer 20. More particularly, the locking mechanism is configured to maintain a constant lock force on a tool coupled to the robotic tool changer 20 even after a motor providing power to the robotic tool changer 20 is removed. Additionally, the locking mechanism of the present disclosure maintains a constant lock force on a tool even after the robotic tool changer 20 experiences mechanical wear. This helps prevent potentially dangerous situations in which a tool coupled to the robotic tool changer 20 might be inadvertently disconnected from the robotic tool changer 20.

Figure 2:
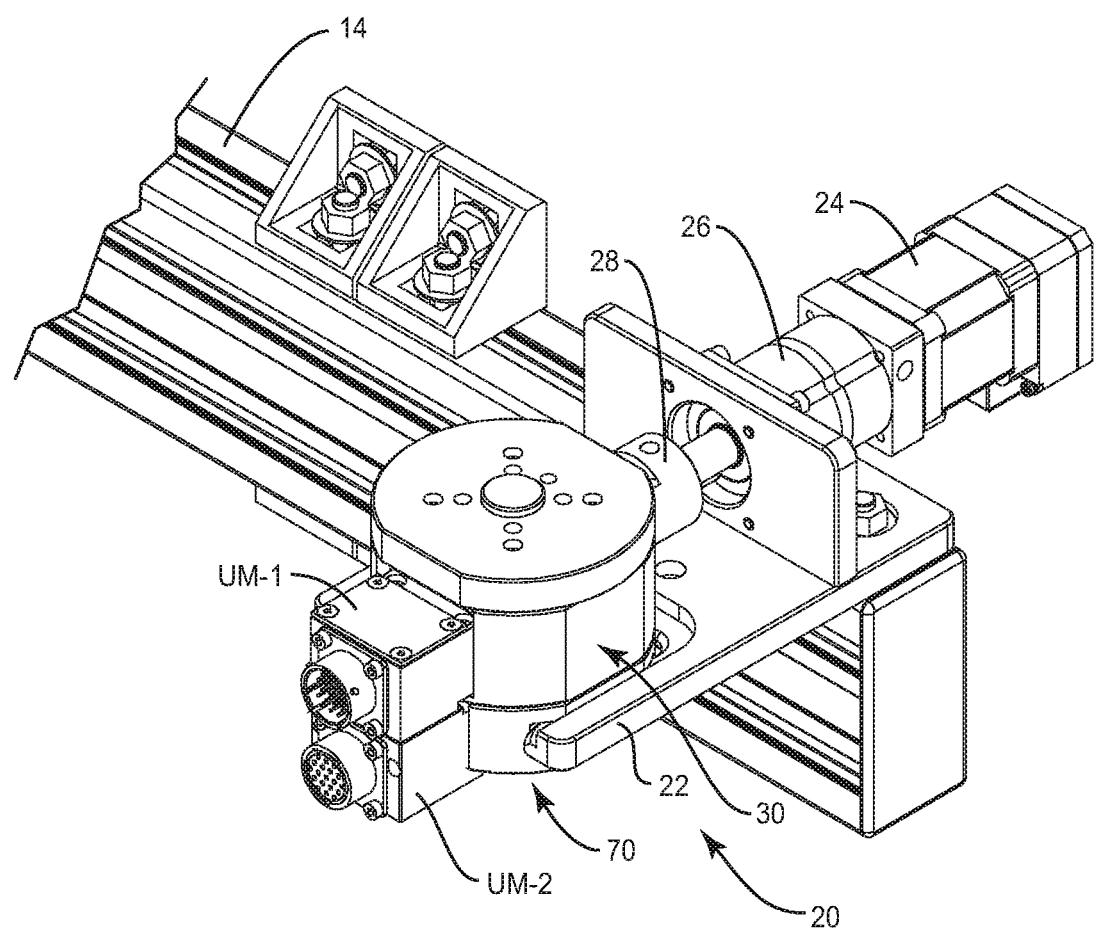
FIG. 2 is a perspective view of a master unit and a tool unit coupled to a drive source according to one embodiment of the present disclosure.

FIG. 2 illustrates one embodiment of the robotic tool changer 20 attached to the horizontal member 14 of tool stand 10. As seen in FIG. 2, the tool changer 20 comprises a master unit 30 and a tool unit 70, and is attached to the horizontal member 14 via a tool stand bracket 22. In one embodiment, the bracket 22 is movable along the horizontal member 14 to allow an operator of the tool changer 20 to change the horizontal position of the master unit 30 and the tool unit 70.

Also seen in FIG. 2 is a drive source 24, a gear box 26, and a drive hub 28. In this embodiment, each of these components is part of the tool stand 10, rather than part of the tool changer 20, as is conventional. Decoupling these components from the tool changer 20 and including them as part of the tool stand 10 reduces the size and weight of the tool changer 20, thereby reducing the payload of the robot.

The drive source 24 comprises a motor. In this embodiment, drive source 24 comprises a brushless stepper motor or servo motor having integrated control circuitry. However, those of ordinary skill in the art should readily appreciate that the illustration of any specific type of motor for drive source 24 is for illustrative purposes only, and that other types of motors are possible. In other embodiments, for example, drive source 24 may comprise a brushed DC motor or a pneumatic rotary motor.

Regardless of the type of motor, however, drive source 24 is configured to connect at one end to a power source (not shown), and to the gearbox 26 at the other end. As described in more detail below, drive source 24 provides the power to the master unit 30 to lock the master unit 30 to, and unlock the master unit 30 from, the tool unit 70. Although any type of drive source 24 may be used with the present embodiments, one aspect of the present disclosure utilizes a motor rated by the National Electrical Manufacturer Association (NEMA) as NEMA 17 or NEMA 23. One example of such a motor is the "Cool Muscle" integrated servo provided by Myostat Motion Control Inc.

In some embodiments, each different tool or type of tool that attaches to the tool unit 70 utilizes a different motor, and thus, a different drive source 24. In these embodiments, therefore, the drive source 24 is switched whenever a new tool is to be coupled to the tool unit 70. In other cases, however, a "universal" drive source 24 that is capable of handling several different tools or types of tools can be utilized. These latter embodiments beneficially lower the cost of the robotic tool changer 10, as well as the costs associated with the operation of the robotic tool changer 10.

The gearbox 26 is attached at one end to the drive source 24, and at the other end to the drive hub 28. As is known in the art, gearbox 26 provides a mechanical advantage by increasing the torque of the drive source 24, while at the same time, reducing the speed of an output shaft (e.g., the shaft that connects to drive hub 28). The output torque and speed of the output shaft in gearbox 26 is determined by the ratio of the gears in gearbox 26. Those of ordinary skill in the art will realize that any type of gearbox 26 may be used with the present embodiments. In one embodiment, however, gearbox 26 comprises a 1-stage epicyclic (planetary) 10:1 gearbox.

The drive hub 28, which may be, for example, a slotted drive hub, couples the master unit 30 to the gearbox 26, and allows the robot to enter and exit tool stand 10 from a top and a side (e.g., a front side) of the tool stand 10. More particularly, one end of the drive hub 28 mounts directly to the output shaft of gearbox 26, while the opposite end of drive hub 28 mounts directly to a crankshaft (seen later in FIG. 3) associated with the master unit 30. In operation, drive source 24 drives the drive hub 28 via gearbox 26, thereby rotating the crankshaft in the master unit 30. As seen in more detail below, the rotating crankshaft moves a piston (seen later in FIG. 3) disposed inside the master unit 30 between an extended position and a retracted position thereby locking and unlocking the tool unit 70 to the master unit 30.

As those of ordinary skill in the art will readily appreciate, robotic tools generally require utilities, such as electrical current, air pressure, hydraulic fluid, cooling water, electronic or optical data signals, and the like, for operation. When numerous different tools requiring different utilities are utilized by the same robot, however, the required utility connections are generally manually established each time a tool is changed. To eliminate the need for such a manual procedure, the robotic tool changer 20 of the present embodiments provides utility-passing modules, such as utility-passing modules UM-1 and UM-2 seen in FIG. 2. Such modules, which may be attached to standardized locations on the master unit 30 and the tool unit 70 of the robotic tool changer 20, function to pass the utilities to operate the tool. Utility-passing modules are well known in the robotics arts, and are commercially available, such as from the assignee of the present disclosure, ATI Industrial Automation of Apex, N.C.

In one embodiment, for example, electrical current required by a tool (not shown) connected to the tool unit 70 of robotic tool changer 20 is provided by a power source (not shown) to UM-1. In turn UM-1 provides the electrical current to the tool via UM-2. In this embodiment, UM-1 and UM-2 are electrically connected. Data and signals collected or generated by the tool are then passed to UM-1 via UM-2. Utility-passing module UM-1 can then provide the data and signals it receives from UM-2 to a computer or other similar device, thereby allowing an operator of the tool to monitor and/or analyze the operation of the tool.

As previously stated, the robotic tool changer 20 of the present embodiments addresses safety concerns associated with tools becoming inadvertently disconnected from the robotic tool changer 20. In particular, the present embodiments provide a locking mechanism for a robotic tool changer 20 that maintains a constant lock force on a tool despite experiencing circumstances that might normally cause the tool to unexpectedly disconnect from the tool unit 70. Such circumstances can cause injury to an operator of the tool and/or damage to the tool itself.

Figure 3:
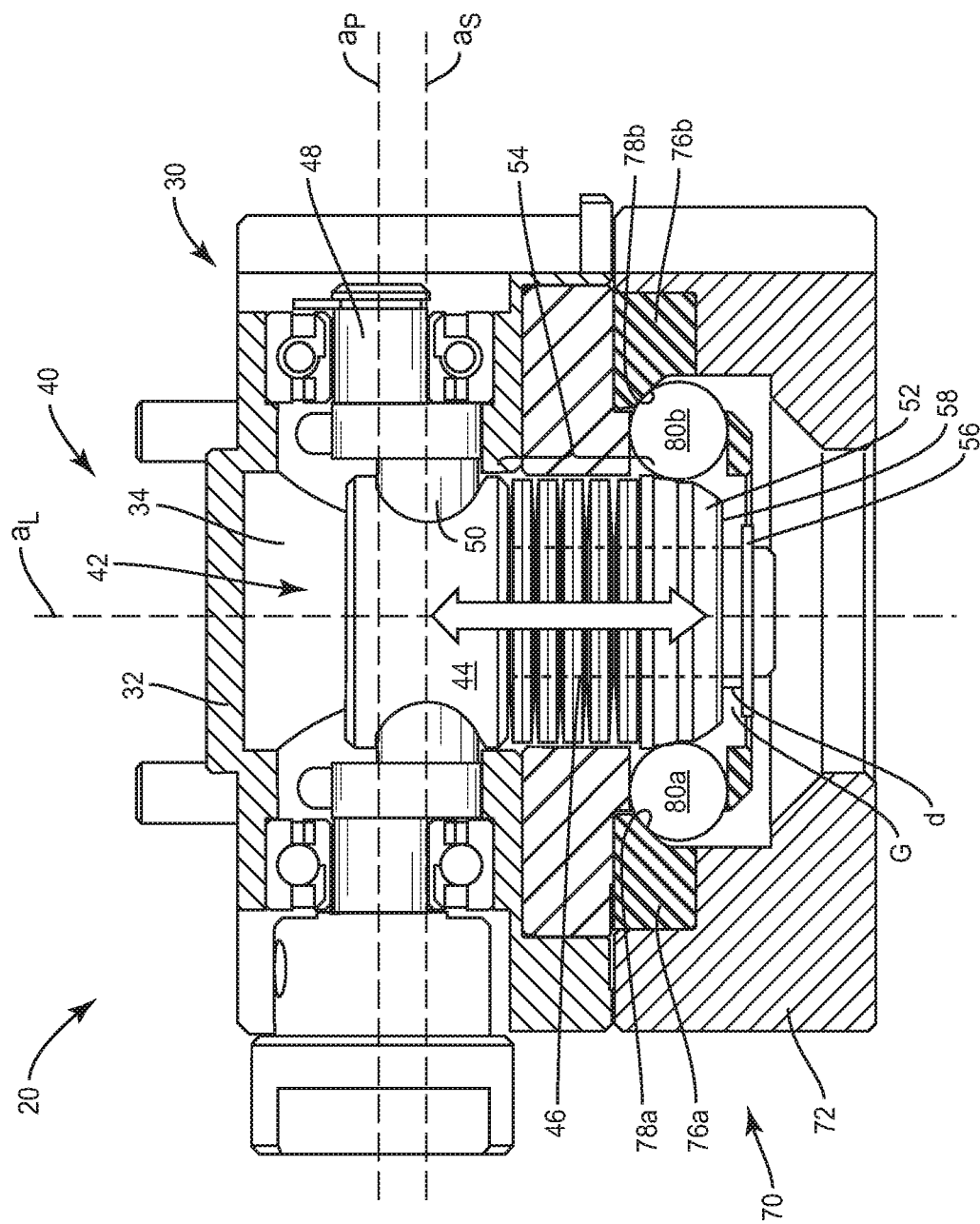
FIG. 3 illustrates components of a locking mechanism in a master unit, as well as the interaction between the locking mechanism and a tool unit, according to one embodiment of the present disclosure.

FIG. 3 illustrates components of a locking mechanism 40 in a master unit 30, as well as the interaction between the locking mechanism 40 and tool unit 70 according to one embodiment of the present disclosure. As seen in FIG. 3, master unit 30 comprises a housing 32 having a central bore 34. A locking mechanism 40 comprises an "over-center" locking mechanism, and is disposed within the central bore 34. In this embodiment, locking mechanism 40 comprises a piston 42 having a piston head 44 connected to a shaft 46, a crankshaft 48, a cam 52 having one or more cam surfaces, a biasing member 54, which in this embodiment comprises a plurality of stacked conical spring washers, a retaining member 56, and a plurality of rolling members 80a, 80b (collectively, rolling members 80). The tool unit 70, which removably connects to the master unit 30, comprises a housing 72, one or more tool bearing races 76a, 76b (collectively, tool bearing race 76), each having a corresponding retention surface 78a, 78b (collectively, retention surface 78). As described in more detail below, tool unit 70 is configured to be attached to a tool and to couple to the master unit 30 as piston 42 moves to the extended position and presses rolling members 80 in the master unit 30 against retention surfaces 78 in the tool unit 70.

The central bore 34 of master unit 30 defines a longitudinal axis $a_L$ along which the piston 42 moves between a retracted position (i.e., an "unlocked position—seen in FIG. 4A) and an extended position (i.e., a "locked" position—seen in FIG. 4B). When piston 40 is in the retracted or "unlocked" position, the tool unit 70 can be freely connected to, and freely disconnected from, the master unit 30. When piston 42 is in the extended or "locked" position, however, the tool unit 70 cannot be disconnected from the master unit 30. More particularly, when the piston 42 is in the extended or locked position, the locking mechanism 40 applies and maintains a substantially constant locking force to the tool unit 70 regardless of whether drive source 24 applies power to one or both of the master unit 30 or the tool unit 70. This substantially constant locking force, which is also maintained regardless of the mechanical wear experienced the robotic tool changer 20, enhances the safety of the robot by reducing or eliminating situations in which the tool unit 70 and any tools connected thereto inadvertently become disconnected from the master unit 30.

The crankshaft 48 in this embodiment comprises a rotating, eccentric shaft that moves the piston 42 along the longitudinal axis $a_L$ between the retracted position and the extended position. As seen in FIG. 3, crankshaft 48 comprises a primary axis $a_P$ transverse to the longitudinal axis $a_L$, and an offset segment 50. The offset segment 50 comprises a secondary axis $a_S$ that is transverse to the longitudinal axis $a_L$, as well as parallel to the primary axis $a_P$ of crankshaft 48. As seen later in more detail, the offset segment 50 is at least partially disposed within an opening of the piston head 44.

To lock a tool unit 70 to the master unit 30, drive source 24 rotates crankshaft 48 in a first direction. As seen later in more detail, this rotation of crankshaft 48 causes offset segment 50 to push on a first internal surface of piston head 44, thereby moving the piston 40 towards the extended position and compressing the biasing member 54, which in this embodiment, comprises a set of Bellville springs. To unlock the tool unit 70 from a master unit 30, drive source 24 rotates crankshaft 48 in a second direction opposite the first direction. Rotation of the crankshaft 48 in the second direction allows the biasing member 54 to expand thereby causing offset segment 50 to push on a second, opposing internal surface of piston head 44. Thus, the piston 40 is moved from the extended position towards the retracted position.

The cam 52 is disposed at one end of the shaft 46 and comprises one or more cam surfaces. In this embodiment, cam 52 is configured to move along longitudinal axis $a_L$ independently of shaft 46 as piston 42 moves between the retracted position and the extended position. When the piston 42 is in the retracted position, the cam 52 exerts little or no force on rolling members 80. As stated above, this permits the tool unit 70 to be freely connected to and disconnected from the master unit 30. However, as the piston 42 moves towards the extended position, the cam surfaces of cam 52 exert an outward force on the rolling members 80. The force exerted by the cam surfaces of cam 52 press the rolling members 80 into contact with one or more of the retention surfaces 78a, 78b of tool bearing races 76.

As described in more detail later, when the piston 42 is in the extended position, the retention surfaces 78a, 78b also exert a force on the cam surfaces of cam 52 via the rolling members 80. This urges piston 42 back toward the retracted position thereby urging the offset segment 50 of crankshaft 48 to rotate further in the first direction beyond the longitudinal axis $a_L$ and toward a mechanical stop. Regardless, in this extended position, the tool unit 70 remains locked to the master unit 30, and cannot be easily removed.

The retaining member 56 is fixedly attached to one end of the shaft 44 such that it does not move freely along the shaft 44. When piston 42 is in the extended position, a gap is formed between a surface of the retaining member 56 and a surface of cam 58. According to the present disclosure, the size of the gap d is proportional to the biasing force exerted on the cam 52 by the biasing members 54. That is, the greater the biasing force exerted by biasing members 54 on cam 52, the greater the gap. The weaker the biasing force exerted by biasing members 54, the narrower the gap.

FIGS. 4A-4B illustrate an embodiment of the locking mechanism 40 in the retracted or "unlocked" position in which the tool unit 70 can be disconnected from the master unit 30 (FIG. 4A), and in the extended or "locked" position in which the tool unit 70 cannot be disconnected from the master unit 30 (FIG. 4B). As seen in FIGS. 4A-4B, the offset segment 50 is disposed within an opening O formed in the head 44 of piston 42. When piston 42 is in the retracted position, the offset segment 50 is in a first radial position (FIG. 4A). To move piston 42 from the retracted position to the extended position, drive source 24 drives crankshaft 48 to rotate in a first direction such that offset segment 50 also travels in the first direction along a radial path R. Movement of the offset segment 50 in the first direction urges piston 42 towards the extended position, and compresses the biasing member 54, which as stated above is movably coupled to shaft 46. This compression biases cam 52 into contact with the rolling members 80 such that cam 52 presses rolling members 80 against the retention surfaces 78 of tool bearing races 76.

As described in more detail below, the offset segment 50 is configured to continue moving along radial path R until it makes contact with a mechanical stop 60. The mechanical stop 60 limits rotation of the crankshaft 48 in the first direction. In this position (FIG. 4B), piston 42 is in the extended position and offset segment 50 is in a second radial position on radial path R. With piston 42 in the extended position, tool unit 70 is locked to the master unit 30 such that tool unit 70 cannot be disconnected from master unit 30, even in the absence of power provided to one or both of the master unit 30 and the tool unit 70, and even after mechanical wear to one or both of the master unit 30 and the tool unit 70.

To return piston 42 to the retracted position from the extended position, drive source 24 rotates crankshaft 48 in a second direction opposite the first direction. Rotation of the crankshaft 48 in the second direction moves offset segment 50 back along radial path R and returns the offset segment 50 to the first radial position. More particularly, movement of the offset segment 50 in the second direction urges piston 42 towards the retracted position. This movement causes the cam 52 to release the rolling members 80 from the pressing engagement with the retention surfaces 76. Additionally, as piston 42 moves from the extended position to the retracted position, the biasing member 54 decompresses thereby biasing piston head 44 of piston 42 towards the retracted position.

The offset segment 50 is configured to continue moving back along radial path R in the second direction until it makes contact with the mechanical stop 60. In this position (FIG. 4A), piston 42 is in the retracted position and offset segment 50 is in the first radial position. Further, the retaining member 56 directly contacts surface 58 of cam 52. With piston 42 in the retracted position, the tool unit 70 can be disconnected from the master unit 30, and a new tool unit 70 connected to the master unit 30.

As seen in the embodiment of FIGS. 4A-4B, offset segment 50 travels through the longitudinal axis $a_L$ when moving piston 42 between the retracted and extended positions. Additionally, regardless of whether piston 42 is in the retracted position or the extended position, the longitudinal axis $a_L$ partitions the offset segment 50 into two unequal cross-sectional areas 50a and 50b such that cross-sectional area 50b is larger than the cross-sectional area 50a. In more detail, as stated above, cam 52 pushes the rolling members 80 into retention surfaces 78 as piston 42 moves to the extended position. However, once the secondary axis $a_R$ moves through the longitudinal axis $a_L$, rolling members 80 exert a force on cam 52 that urges offset segment 50 further in the first direction along radial path R toward mechanical stop 60, and opposes rotation of the crankshaft 48 in the second direction. In this position (the second radial position), the secondary axis $a_R$ of offset segment 50 is disposed between the longitudinal axis $a_L$ and the mechanical stop 60. Such positioning helps piston 42 to remain in the extended position and maintain a substantially constant locking force pressing rolling members 80 against the retention surface 78 in the absence of power provided by the drive source.

The embodiment illustrated in FIGS. 4A-4B illustrates offset segment 50 as moving along radial path R through an angle that is greater than 180 degrees. However, those of ordinary skill in the art will readily appreciate that this is for illustrative purposes only, and that in other embodiments, offset segment 50 may be configured to move along radial path R through an angle that is less than 180 degrees, and in some cases, equal to 180 degrees. Thus, while FIGS. 4A and 4B illustrate particular locations for the first and second radial positions of offset segment 50 on radial path R, the present disclosure is not so limited. The first and/or second radial positions of offset segment 50 may be located anywhere along radial path R, so long as when piston 42 is in the extended position, the secondary axis $a_R$ of offset segment 50 is disposed between the longitudinal axis $a_L$ and the mechanical stop 60.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A robotic tool changer, comprising:
a master unit configured to be attached to a robot and to couple to a tool unit, the master unit comprising:
a housing having a central bore defining a longitudinal axis;
a piston disposed within the central bore and moveable along the longitudinal axis between a retracted position and an extended position, the piston comprising:
a shaft;
a head attached to a first end of the shaft and comprising the opening configured to receive the offset segment of the crankshaft;
a retaining member attached to a second end of the shaft opposite the first end;
a cam disposed between the head and the retaining member and movably coupled to the shaft, the cam configured to move along the longitudinal axis independently of the shaft as the piston moves between the retracted position and the extended position; and
a biasing member movably coupled to the shaft and disposed between the head and the cam, the biasing member configured to:
bias the cam to press the rolling members against the retention surface as the piston moves from the retracted position to the extended position; and
bias the head towards the retracted position as the piston moves from the extended position to the retracted position;
a crankshaft having a primary axis transverse to the longitudinal axis and comprising an offset segment disposed within an opening in the piston, the crankshaft configured to rotate in a first direction to move the piston along the longitudinal axis from the retracted position to the extended position;
a mechanical stop configured to contact a sidewall of the offset segment and thereby limit the rotation of the crankshaft in the first direction; and
wherein the offset segment has a secondary axis parallel to the primary axis, and wherein the secondary axis is disposed between the longitudinal axis and the mechanical stop when the piston is in the extended position; and
wherein the tool unit is configured to be attached to a tool and to couple to the master unit as the piston moves to the extended position and presses rolling members in the master unit against a retention surface in the tool unit.

2. The robotic tool changer of claim 1 wherein, when the master unit and the tool unit are coupled together, the rolling members exert a force on the piston urging it toward the retracted position, thereby urging the offset segment of the crankshaft to rotate further in the first direction beyond the longitudinal axis and toward the mechanical stop.

3. The robotic tool changer of claim 2 wherein the crankshaft is further configured to rotate in a second direction, opposite the first direction, to move the piston from the extended position to the retracted position.

4. The robotic tool changer of claim 3 wherein when the piston is in the extended position, the force applied to the piston by the rolling members opposes the rotation of the crankshaft in the second direction.

5. The robotic tool changer of claim 1 wherein the biasing member comprises a plurality of stacked conical spring washers.

6. The robotic tool changer of claim 1 wherein:
when the piston is in the retracted position, the retaining member directly contacts a surface of the cam; and
when the piston is in the extended position, the retaining member is spaced away from the surface of the cam thereby forming a gap between the surface of the cam and the retaining member.

7. The robotic tool changer of claim 6 wherein a size of the gap between the surface of the cam and the retaining member is proportional to a biasing force exerted on the cam by the biasing member.

8. The robotic tool changer of claim 1 wherein the crankshaft is configured to connect to an external drive source, and wherein the piston is configured to remain in the extended position and maintain a substantially constant force pressing the rolling members against the retention surface in an absence of power provided by the drive source.

9. The robotic tool changer of claim 1 wherein the longitudinal axis divides a cross-section of the offset segment of the crankshaft into first and second unequal cross-sectional areas with the first cross-sectional area being larger than the second cross-sectional area when the piston is in the retracted position, and with the second cross-sectional area being larger than the first cross-sectional area when the piston is in the extended position.

10. A robotic tool changer comprising:
a master unit configured to connect to both a tool unit and a robot, the master unit comprising:
a piston configured to move within a housing along a longitudinal axis between a retracted position in which the tool unit can be disconnected from the master unit, and an extended position in which the tool unit cannot be disconnected from the master unit; and
a crankshaft configured to be connected to a drive source and comprising:
a primary axis transverse to the longitudinal axis; and
an offset segment having a secondary axis parallel to the primary axis and disposed within an opening in the piston, the offset segment configured to move along a radial path in a first direction to move the piston from the retracted position to the extended position; and
wherein as the piston moves to the extended position, the secondary axis moves through the longitudinal axis such that when the piston is in the extended position, the longitudinal axis divides a cross-section of the offset segment of the crankshaft into first and second unequal cross-sectional areas with the first cross-sectional area comprising the secondary axis and being larger than the second cross-sectional area.

11. The robotic tool changer of claim 10 wherein the piston is configured to remain in the extended position to maintain a substantially constant lock force on the tool unit in an absence of power provided by the drive source.

12. The robotic tool changer of claim 10 wherein:
when the piston is in the retracted position, the offset segment is in a first radial position at a first terminal end of the radial path; and
when the piston is in the extended position, the offset segment is in a second radial position at a second terminal end of the radial path.

13. The robotic tool changer of claim 12 wherein the offset segment is configured to move along the radial path:
from the first radial position to the second radial position to move the piston to the extended position; and
from the second radial position to the first radial position to move the piston to the retracted position.

14. The robotic tool changer of claim 12 further comprising a mechanical stop configured to limit movement of the offset segment beyond the second radial position.

15. The robotic tool changer of claim 10 and wherein the piston comprises:
a head comprising the opening configured to receive the offset segment;
a cam movably attached to a shaft of the piston and configured to extend into the tool unit when the piston moves toward the extended position;
a retaining member attached to the shaft proximate the cam; and
a biasing member disposed between the head and the cam.

16. The robotic tool changer of claim 15 wherein when the master unit is coupled to the tool unit and the piston is in the extended position, rolling members in the master unit apply a force to the one or more cam surfaces on the cam that urges the offset segment to move further along the radial path to the second radial position.

17. The robotic tool changer of claim 15 wherein:
when the piston is in the retracted position, the retaining member directly contacts a surface of the cam; and
when the piston is in the extended position, the retaining member is spaced away from the surface of the cam thereby forming a gap between the surface of the cam and the retaining member, wherein a size of the gap is proportional to a biasing force exerted by the biasing member.

18. A robotic tool changer comprising:
a master unit configured to connect to both a tool unit and a robot, the master unit comprising:
a piston comprising a shaft and a head, and configured to move within a housing along a longitudinal axis between a retracted position in which the tool unit can be disconnected from the master unit, and an extended position in which the tool unit cannot be disconnected from the master unit;
a crankshaft comprising a primary axis transverse to the longitudinal axis, and an offset segment disposed within an opening in the head of the piston, the crankshaft configured to rotate in a first direction to move the piston between the retracted and extended positions;
a cam movably coupled to the shaft, and configured to move along the longitudinal axis independently of the shaft as the piston moves between the retracted position and the extended position;
a biasing member disposed between the head of the piston and the cam;
a retaining member disposed on the shaft proximate the cam, wherein the retaining member is spaced away from the cam when the piston is in the extended position, and contacts the cam when the piston is in the retracted position; and
wherein a distance between the retaining member and the cam when the piston is in the extended position is proportional to a biasing force exerted by the biasing member on the retaining member.

19. The robotic tool changer of claim 18 further comprising a mechanical stop configured to limit the rotation of the crankshaft in the first direction.

20. The robotic tool changer of claim 19 wherein the offset segment has a secondary axis parallel to the primary axis, and wherein the secondary axis is disposed between the longitudinal axis and the mechanical stop when the piston is in the extended position.

21. The robotic tool changer of claim 19 wherein when the master unit is coupled to the tool unit and the piston is in the extended position, one or more cam surfaces on the cam are configured to receive a force applied by rolling members in the master unit that urges the piston toward the retracted position, thereby urging the offset segment towards the mechanical stop.

22. The robotic tool changer of claim 18 wherein the crankshaft is configured to be connected to an external drive source that drives the crankshaft to move the piston between the retracted position and the extended position, and wherein the crankshaft is configured to maintain the piston in the extended position in an absence of power provided by the drive source.

23. A robotic tool changer, comprising:
a master unit configured to be attached to a robot and to couple to a tool unit, the master unit comprising:
a housing having a central bore defining a longitudinal axis;

a piston disposed within the central bore and moveable along the longitudinal axis between a retracted position and an extended position;

a crankshaft having a primary axis transverse to the longitudinal axis and comprising an offset segment disposed within an opening in the piston, the crankshaft configured to rotate in a first direction to move the piston along the longitudinal axis from the retracted position to the extended position;

a mechanical stop configured to limit the rotation of the crankshaft in the first direction; and wherein the offset segment has a secondary axis parallel to the primary axis, and wherein the secondary axis is disposed between the longitudinal axis and the mechanical stop when the piston is in the extended position;

wherein the tool unit is configured to be attached to a tool and to couple to the master unit as the piston moves to the extended position and presses rolling members in the master unit against a retention surface in the tool unit; and wherein the crankshaft is configured to connect to an external drive source, and wherein the piston is configured to remain in the extended position and maintain a substantially constant force pressing the rolling members against the retention surface in an absence of power provided by the drive source.

* * * * *